US010972642B2

(12) United States Patent
Mayumi (10) Patent No.: US 10,972,642 B2
(45) Date of Patent: Apr. 6, 2021

(54) IMAGER AND IMAGING DEVICE (71) Applicant: FUJIFILM Corporation, Tokyo (JP)

(72) Inventor: Kazuya Mayumi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/941,497

(22) Filed: Jul. 28, 2020

(65) Prior Publication Data

US 2020/0358973 A1 Nov. 12, 2020

Related U.S. Application Data (63) Continuation of application No. PCT/JP2019/001280, filed on Jan. 17, 2019.

(30) Foreign Application Priority Data

Jan. 29, 2018 (JP) .............................. JP2018-012900

(51) Int. Cl.
H04N 5/225 (2006.01)
(52) U.S. Cl.
CPC ................. H04N 5/2253 (2013.01)
(58) Field of Classification Search
CPC ............. H04N 5/2252; H04N 5/22521; H04N 5/2253; H04N 5/2254; H04N 5/2257; H04N 5/2258; H05K 1/0271; H05K 2201/10121; H01L 31/0203; H01L 23/02–15
See application file for complete search history.

(56) References Cited

U.S. PATENT DOCUMENTS

| 6,163,456 A | 12/2000 | Suzuki et al. |
| 2005/0110107 A1 | 5/2005 | Yamamoto et al. |
| 2006/0128044 A1 | 6/2006 | Yamamoto et al. |
| 2006/0234767 A1 | 10/2006 | Nishikawa et al. |
| 2007/0030334 A1 | 2/2007 | Nishizawa |
| 2007/0187791 A1 | 8/2007 | Yamamoto et al. |
| 2012/0211640 A1 | 8/2012 | Suzuki |

(Continued)

FOREIGN PATENT DOCUMENTS

| CN | 1229330 | 9/1999 |
| CN | 1778101 | 5/2006 |

(Continued)

OTHER PUBLICATIONS

"International Search Report (Form PCT/ISA/210) of PCT/JP2019/001280," dated Feb. 19, 2019, with English translation thereof, pp. 1-5.

(Continued)

*Primary Examiner* — Paul M Berardesca
(74) *Attorney, Agent, or Firm* — JCIPRNET (57) ABSTRACT

An imager includes: a fixing member as defined herein; a sealing member as defined herein; a circuit board as defined herein; and a conductive member as defined herein, in a state of being viewed from a direction perpendicular to a light receiving surface of the imaging sensor chip, an outer edge of a region where the conductive member is disposed overlaps the wall portion of the fixing member, and a distance between a position overlapping the outer edge in the wall portion and an end of the wall portion on a side of the concave portion is 20% or more of a width of the wall portion in a direction parallel to the light receiving surface.

7 Claims, 6 Drawing Sheets

(56) References Cited

U.S. PATENT DOCUMENTS

| | | |
|---|---|---|
| 2013/0098654 A1 | 4/2013 | Iizuka et al. |
| 2014/0240588 A1* | 8/2014 | Sakuragi .............. H04N 5/2252 |
| | | 348/373 |
| 2015/0054107 A1 | 2/2015 | Miyake |
| 2015/0054112 A1 | 2/2015 | Iwama et al. |
| 2015/0325611 A1* | 11/2015 | Jun ........................ H01L 24/97 |
| | | 257/434 |
| 2017/0104023 A1 | 4/2017 | Miyake |
| 2019/0088570 A1 | 3/2019 | Mada et al. |

FOREIGN PATENT DOCUMENTS

| | | |
|---|---|---|
| CN | 102646692 | 8/2012 |
| CN | 104425632 | 3/2015 |
| JP | 2005020687 | 1/2005 |
| JP | 2005158948 | 6/2005 |
| JP | 2009176961 | 8/2009 |
| JP | 2011018747 | 1/2011 |
| JP | 2011071422 | 4/2011 |
| JP | 2015032653 | 2/2015 |
| JP | 2015038996 | 2/2015 |
| JP | 2018014767 | 1/2018 |
| WO | 2017163925 | 9/2017 |

OTHER PUBLICATIONS

"Written Opinion of the International Searching Authority (Form PCT/ISA/237) of PCT/JP2019/001280," dated Feb. 19, 2019, with English translation thereof, pp. 1-7.

"Office Action of China Counterpart Application", dated Nov. 26, 2020, with English translation thereof, p. 1-p. 12.

* cited by examiner

IMAGER AND IMAGING DEVICE

CROSS REFERENCE TO RELATED APPLICATION

This is a continuation of International Application No. PCT/JP2019/001280 filed on Jan. 17, 2019, and claims priority from Japanese Patent Application No. 2018-012900 filed on Jan. 29, 2018, the entire disclosures of which are incorporated herein by reference.

BACKGROUND OF THE INVENTION

1. Field of the Invention

The present invention relates to an imager and an imaging device.

2. Description of the Related Art

Recently, there has been a rapid increase in demand for an information device having an imaging function, such as a digital still camera, a digital video camera, a portable telephone such as a smartphone, a tablet terminal, and an endoscope in accordance with an increase in resolution of an imaging sensor such as a charge coupled device (CCD) image sensor or a complementary metal oxide semiconductor (CMOS) image sensor. An electronic device having an imaging function as described above is referred to as an imaging device.

The imaging device comprises an imager including an imaging sensor chip that is a semiconductor chip, a package that houses the imaging sensor chip, and a circuit board on which the package is mounted.

JP2009-176961A, JP2011-071422A, and JP2015-038996A disclose a structure of a unit including an electronic component, a package that houses the electronic component, and a circuit board on which the package is mounted.

SUMMARY OF THE INVENTION

In a case where the package that houses the semiconductor chip is mounted on the circuit board, the unit is placed in a state of a high temperature in a step of electrically connecting the package and the circuit board to each other with a solder. In a case where the temperature of the unit decreases after completion of this step, a warpage due to a bimetal effect occurs due to a difference in linear expansion coefficients of components of the unit.

In a case where the semiconductor chip is an imaging sensor chip, a flatness of a light receiving surface of the imaging sensor chip cannot be ensured due to a warpage caused by a bimetal effect. In a case where the light receiving surface warps in this way, a focus shifts around the light receiving surface, which affects an image quality. In a case where a size of the imaging sensor chip is large, it is particularly important to take measures against a warpage due to a bimetal effect. JP2009-176961A, JP2011-071422A, and JP2015-038996A do not recognize such a problem of the warpage of the imaging sensor chip.

The present invention has been made in view of the above circumstances, and an object of the present invention is to provide an imager capable of improving an image quality by preventing a warpage of an imaging sensor chip, and an imaging device comprising the imager.

An imager of an embodiment of the present invention comprises: a fixing member that has a concave portion in which an imaging sensor chip is fixed to a bottom surface, a wall portion surrounding the concave portion, and a plurality of first terminals electrically connected to the imaging sensor chip; a sealing member that seals the imaging sensor chip by closing the concave portion in a state of overlapping the wall portion of the fixing member; a circuit board that is disposed facing a surface opposite to the bottom surface of the fixing member and has a larger linear expansion coefficient than the fixing member; and a conductive member that is provided between the first terminal exposed from the surface of the fixing member and a second terminal formed on the circuit board to fix the fixing member and the circuit board and electrically connect the first terminal and the second terminal to each other, in which, in a state of being viewed from a direction perpendicular to a light receiving surface of the imaging sensor chip, an outer edge of a region where the conductive member is disposed overlaps the wall portion of the fixing member, and a distance between a position overlapping the outer edge in the wall portion and an end of the wall portion on a side of the concave portion is 20% or more of a width of the wall portion in a direction parallel to the light receiving surface.

An imaging device of the embodiment of the present invention comprises the above-described imager.

According to the present invention, it is possible to provide an imager capable of improving an image quality by preventing a warpage of an imaging sensor, and an imaging device comprising the imager.

DESCRIPTION OF THE PREFERRED EMBODIMENTS

Hereinafter, embodiments of the present invention will be described with reference to the drawings.

Figure 1:
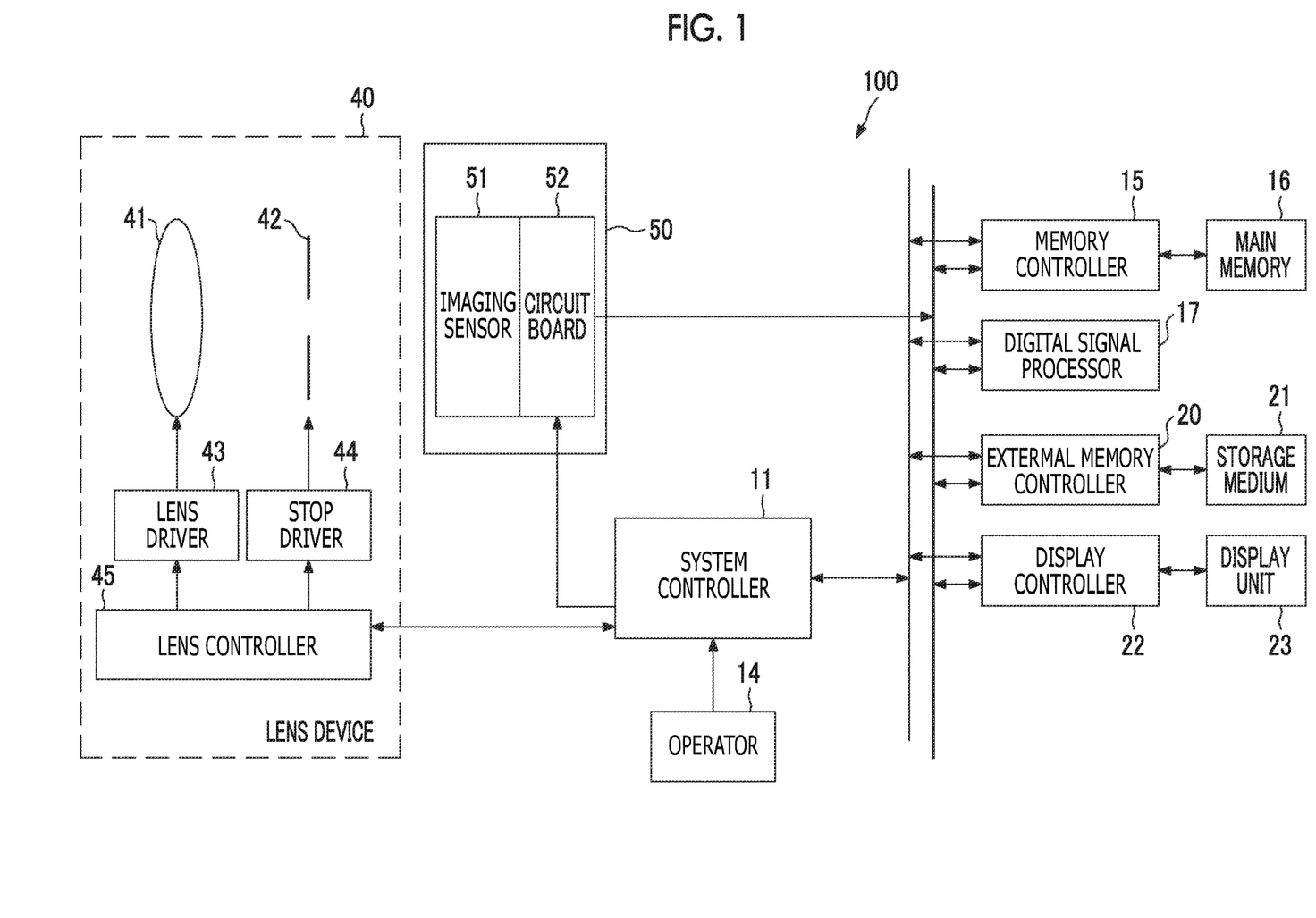
FIG. 1 is a diagram showing a schematic configuration of a digital camera 100 that is an embodiment of an imaging device of the embodiment of the present invention.

FIG. 1 is a diagram showing a schematic configuration of a digital camera 100 that is an embodiment of an imaging device of the embodiment of the present invention.

The digital camera 100 shown in FIG. 1 comprises a lens device 40 having an imaging lens 41, a stop 42, a lens driver 43, a stop driver 44, and a lens controller 45.

The lens device 40 may be detachable from a main body of the digital camera 100, or may be integrated with the main body of the digital camera 100.

The imaging lens 41 includes a focus lens or a zoom lens that can move in an optical axis direction.

The lens controller 45 of the lens device 40 is configured to be able to communicate with a system controller 11 of the digital camera 100 by wire or wireless means.

According to a command from the system controller 11, the lens controller 45 changes a position of a principal point of the focus lens by driving the focus lens included in the imaging lens 41 via the lens driver 43, or controls the aperture amount of the stop 42 via the stop driver 44.

The digital camera 100 further comprises an imager 50 for imaging a subject through an imaging optical system, the system controller 11, and an operator 14.

The imager 50 comprises an imaging sensor 51 such as a CCD image sensor or a CMOS image sensor, and a circuit board 52 on which the imaging sensor 51 is mounted.

The imaging sensor 51 has a light receiving surface (light receiving surface 10 in FIG. 3 which will be described later) in which a plurality of pixels are two-dimensionally arranged, and converts an image of the subject formed on the light receiving surface by the imaging optical system into an electric signal (pixel signal) by the plurality of pixels and outputs the electric signal.

The system controller 11 drives the imaging sensor 51 to output the image of the subject captured through the imaging optical system of the lens device 40 as a captured image signal.

A command signal from a user is input to the system controller 11 through the operator 14.

The system controller 11 collectively controls the entire digital camera 100, and has a hardware structure of various processors that execute programs to perform processing.

The various processors include a central processor (CPU) that is a general-purpose processor executing a program to perform various types of processing, a programmable logic device (PLD) that is a processor of which a circuit configuration can be changed after manufacturing such as a field programmable gate array (FPGA), or a dedicated electric circuit that is a processor having a circuit configuration designed to be dedicated to executing specific processing such as an application specific integrated circuit (ASIC).

More specifically, structures of the various processors are electric circuits in which circuit elements such as semiconductor elements are combined.

The system controller 11 may be constituted by one of the various processors, or may be constituted by a combination of two or more processors of the same type or different types (for example, a combination of a plurality of FPGAs or a combination of a CPU and an FPGA).

Further, an electric control system of the digital camera 100 comprises a main memory 16 constituted by a random access memory (RAM), a memory controller 15 that controls data storage in the main memory 16 and data read from the main memory 16, a digital signal processor 17 that performs digital signal processing on the captured image signal output from the imager 50 to generate captured image data according to various formats such as a joint photographic experts group (JPEG) format, an external memory controller 20 that controls data storage in a storage medium 21 and data read from the storage medium 21, a display unit 23 that is constituted by an organic electroluminescence (EL) display or a liquid crystal display, and a display controller 22 that controls a display on the display unit 23.

Figure 2:
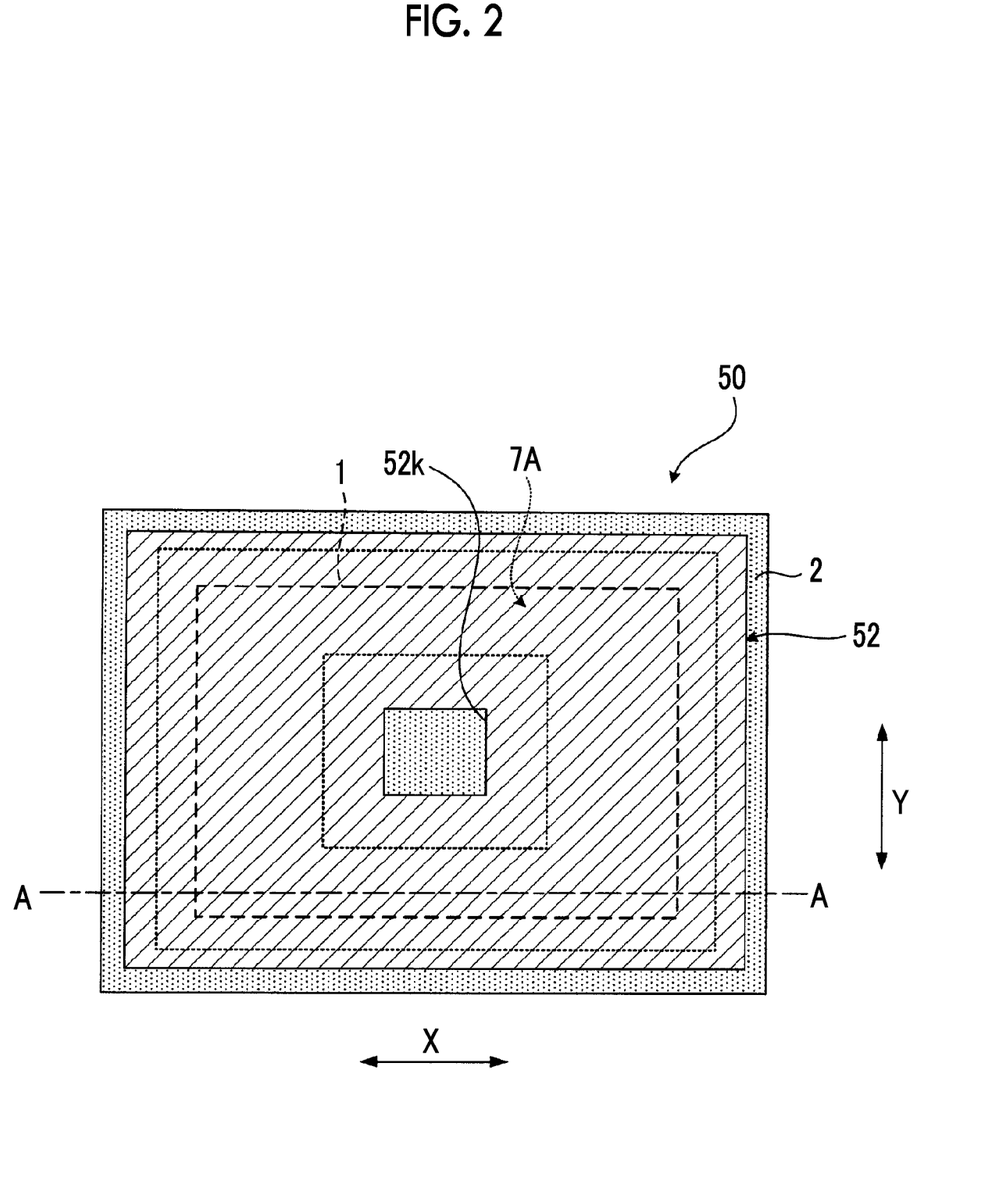
FIG. 2 is a rear view of an imager 50 in the digital camera 100 shown in FIG. 1 as viewed from a circuit board 52 side.
Figure 3:
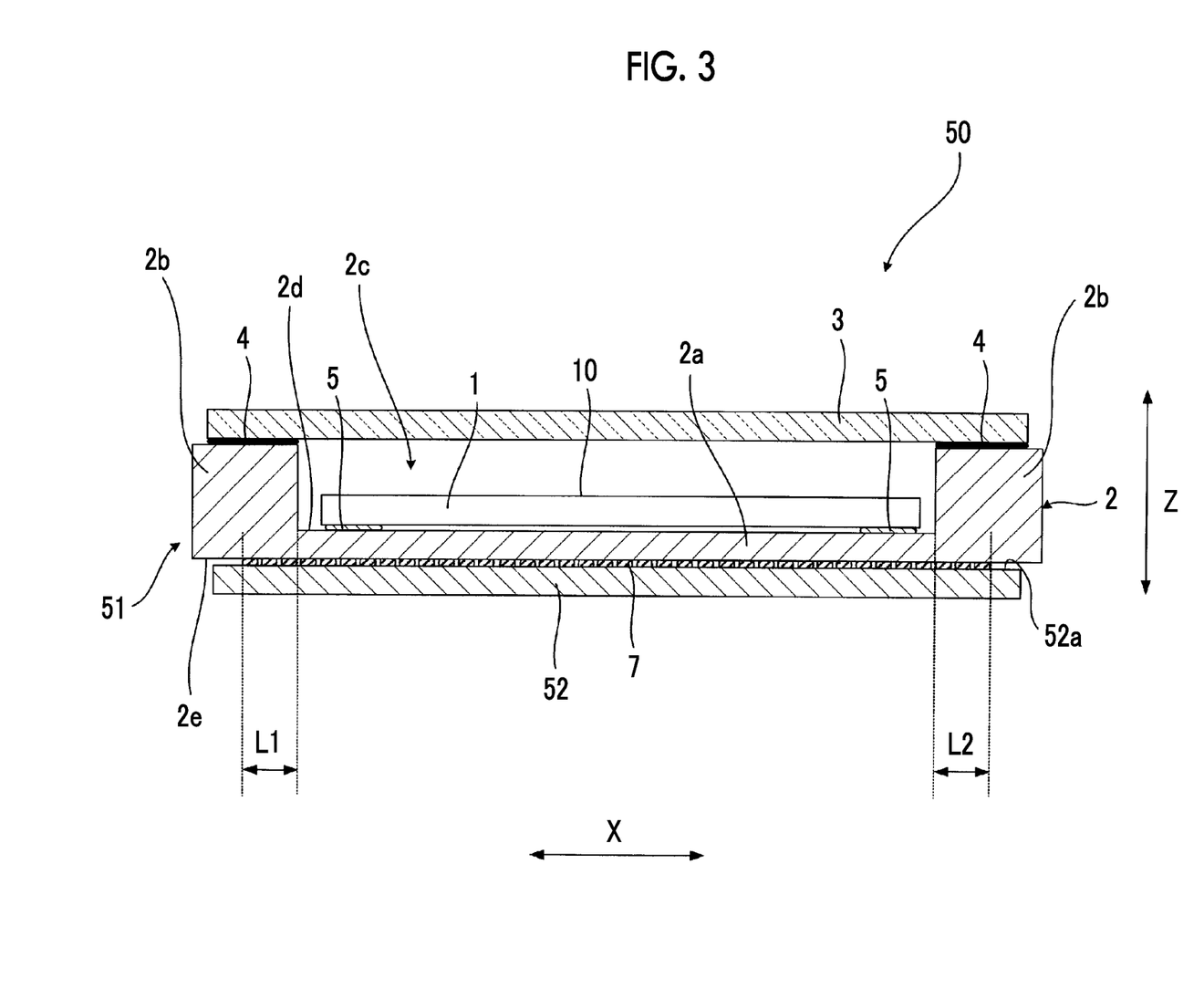
FIG. 3 is a schematic cross-sectional view taken along line A-A of the imager 50 shown in FIG. 2.

FIG. 2 is a rear view of the imager 50 in the digital camera 100 shown in FIG. 1 as viewed from the circuit board 52 side. FIG. 3 is a schematic cross-sectional view taken along line A-A of the imager 50 shown in FIG. 2.

As shown in FIG. 3, the imager 50 comprises the imaging sensor 51 and the circuit board 52 fixed to a rear surface of the imaging sensor 51.

The imaging sensor 51 comprises a package 2 that has a bottom portion 2*a* having a plate shape such as a rectangular plate shape or a circular plate shape and a wall portion 2*b* erected at an end of the bottom portion 2*a* and having a frame shape such as a rectangular frame shape or a circular frame shape. The package 2 is configured to have a concave portion 2*c* in a portion surrounded by the wall portion 2*b*.

The imaging sensor 51 further comprises an imaging sensor chip 1 fixed to a bottom surface 2*d* of the concave portion 2*c* of the package 2, and a protective cover 3 constituted by a light-transmissive member such as a resin or a glass, which is fixed to an upper surface of the wall portion 2*b* of the package 2 with an adhesion material 4 and seals the imaging sensor chip 1 by closing the concave portion 2*c* of the package 2. The package 2 constitutes a fixing member, and the protective cover 3 constitutes a sealing member.

The imaging sensor chip 1 is a semiconductor chip including a photoelectric conversion element such as a photodiode, and a light receiving surface 10 on which a readout circuit that converts charges accumulated in the photoelectric conversion element into signals and read out the signals is formed. The imaging sensor chip 1 has a rectangular planar shape as shown in FIG. 2 and is fixed to the bottom surface 2*d* of the package 2 by an adhesion member 5 such as a resin used as a die bonding material.

FIG. 3 shows a direction Z perpendicular to the light receiving surface 10 of the imaging sensor chip 1 and a direction X that is a long side direction of the imaging sensor chip 1. FIG. 2 shows a direction Y that is a short side direction of the imaging sensor chip 1. FIG. 2 is a diagram of the imager 50 viewed from the circuit board 52 side in the direction Z. The direction X and the direction Y are directions parallel to the light receiving surface 10, respectively.

The package 2 is constituted by an insulating material such as alumina ceramic, or has a multilayer structure in which a conductive layer consisting of a conductive member such as tungsten and an insulating layer made from an insulating material such as alumina ceramic are laminated.

A large number of terminals (not shown) are formed on the bottom surface 2*d* of the concave portion 2*c* of the package 2, and these terminals are electrically connected to electrode pads formed on the imaging sensor chip 1 by conductive wires (not shown). Further, first terminals that are electrically connected to the terminals formed on the bottom surface 2*d* of the concave portion 2*c* of the package 2 are exposed on the rear surface 2*e* of the package 2 opposite to the side to which the protective cover 3 is fixed.

The circuit board 52 is adhered and fixed to the rear surface 2*e* of the package 2 by a plurality of conductive members 7 (see FIG. 3). The conductive member 7 is in contact with each of the plurality of first terminals exposed on the rear surface 2*e* of the package 2.

The circuit board 52 is a frame-shaped and plate-shaped member having an opening 52*k* at the center in the example shown in FIG. 2. On the circuit board 52, a circuit for driving the imaging sensor chip 1, a circuit for processing a signal output from the imaging sensor chip 1, and the like are formed. On a surface 52*a* of the circuit board 52 on the side fixed to the package 2, terminals (second terminals) of these circuits are formed at positions in contact with the conductive member 7.

Therefore, the second terminal of the circuit included in the circuit board 52 and the first terminal formed on the rear surface of the package 2 are electrically connected to each other by the conductive member 7.

The circuit board 52 includes, for example, an insulating layer made of a glass epoxy resin or the like, a conductive layer made of copper or the like, and a solder resist layer, but other well-known ones can be adopted. As the circuit board 52, one having a linear expansion coefficient larger than that of the package 2 is used.

As shown in FIG. 2, the conductive member 7 is disposed in a region 7A whose planar shape is indicated by a frame-shaped broken line. The conductive member 7 may be constituted by a conductive material having an adhesion function, and for example, a solder consisting of an alloy of lead and tin or a solder consisting of an alloy of tin and copper is used.

Figure 4:
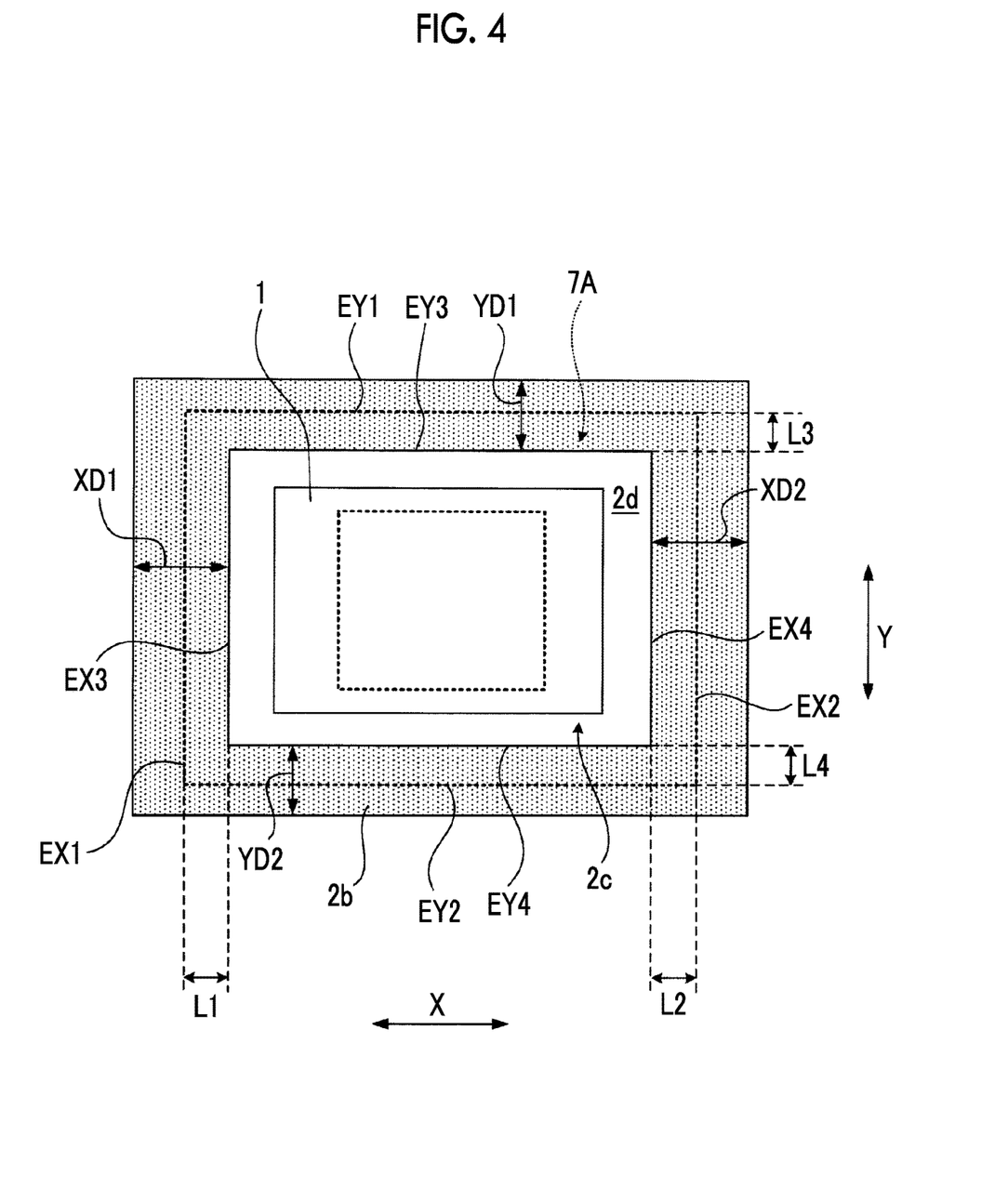
FIG. 4 is a front view of the imager 50 shown in FIG. 2 as viewed in a direction Z from an imaging sensor 51 side.

FIG. 4 is a front view of the imager 50 shown in FIG. 2 as viewed in a direction Z from the imaging sensor 51 side. In FIG. 4, illustration of the protective cover 3 shown in FIG. 3 is omitted.

As shown in FIG. 4, an outer edge of the region 7A where the conductive member 7 for fixing and electrically connecting the circuit board 52 and the package 2 to each other is formed overlaps the wall portion 2b of the package 2.

Specifically, the outer edge of the region 7A is constituted by an edge EX1 on one side of the region 7A in the direction X, an edge EX2 on the other side of the region 7A in the direction X, an edge EY1 on one side of the region 7A in the direction Y, and an edge EY2 on the other side of the region 7A in the direction Y. The edge EX1, the edge EX2, the edge EY1, and the edge EY2 are all located at positions overlapping the wall portion 2b of the package 2.

In the imager 50, the linear expansion coefficient of the circuit board 52 is larger than the linear expansion coefficient of the package 2 adhered to the circuit board 52. Therefore, a stress is applied to the package 2 by a bimetal effect after the circuit board 52 and the package 2 are adhered to each other by the conductive member 7.

As shown in FIG. 4, in a case where the outer edge of the region 7A overlaps the wall portion 2b, the stress applied to the package 2 from the circuit board 52 is distributed to the protective cover 3 via the wall portion 2b. As a result, the warpage of the package 2 is reduced, so that the warpage of the imaging sensor chip 1 can be reduced.

The inventor found that the warpage of the imaging sensor chip 1 can be reduced to a practically allowable level by setting the position of the outer edge of the region 7A to satisfy the following conditions (a), (b), (c), and (d).

(a)

As shown in FIG. 4, a distance between the edge EX1 of the region 7A and an end EX3 of the wall portion 2b overlapping the edge EX1 on a side of the concave portion 2c in the direction X is denoted by L1, and a width in the direction X of the wall portion 2b where the edge EX1 overlaps is denoted by XD1. Assuming that $L1=\alpha 1 \times (XD1)$, $\alpha 1$ is 0.2 or more and 1.0 or less, and preferably 0.2 or more and 0.6 or less.

(b)

As shown in FIG. 4, a distance between the edge EX2 of the region 7A and an end EX4 of the wall portion 2b overlapping the edge EX2 on the side of the concave portion 2c in the direction X is denoted by L2, and a width in the direction X of the wall portion 2b where the edge EX2 overlaps is denoted by XD2. Assuming that $L2=\alpha 2 \times (XD2)$, $\alpha 2$ is 0.2 or more and 1.0 or less, and preferably 0.2 or more and 0.6 or less.

(c)

As shown in FIG. 4, a distance between the edge EY1 of the region 7A and an end EY3 of the wall portion 2b overlapping the edge EY1 on the side of the concave portion 2c in the direction Y is denoted by L3, and a width in the direction Y of the wall portion 2b where the edge EY1 overlaps is denoted by YD1. Assuming that $L3=\alpha 3 \times (YD1)$, $\alpha 3$ is 0.2 or more and 1.0 or less, and preferably 0.2 or more and 0.6 or less.

(d)

As shown in FIG. 4, a distance between the edge EY2 of the region 7A and an end EY4 of the wall portion 2b overlapping the edge EY2 on the side of the concave portion 2c in the direction Y is denoted by L4, and a width in the direction Y of the wall portion 2b where the edge EY2 overlaps is denoted by YD2. Assuming that $L4=\alpha 4 \times (YD2)$, $\alpha 4$ is 0.2 or more and 1.0 or less, and preferably 0.2 or more and 0.6 or less.

The distance L1 and the distance L2 may be the same value or different values. The distance L3 and the distance L4 may be the same value or different values. Further, the distances L1 to L4 may be different values, respectively.

Figure 5:
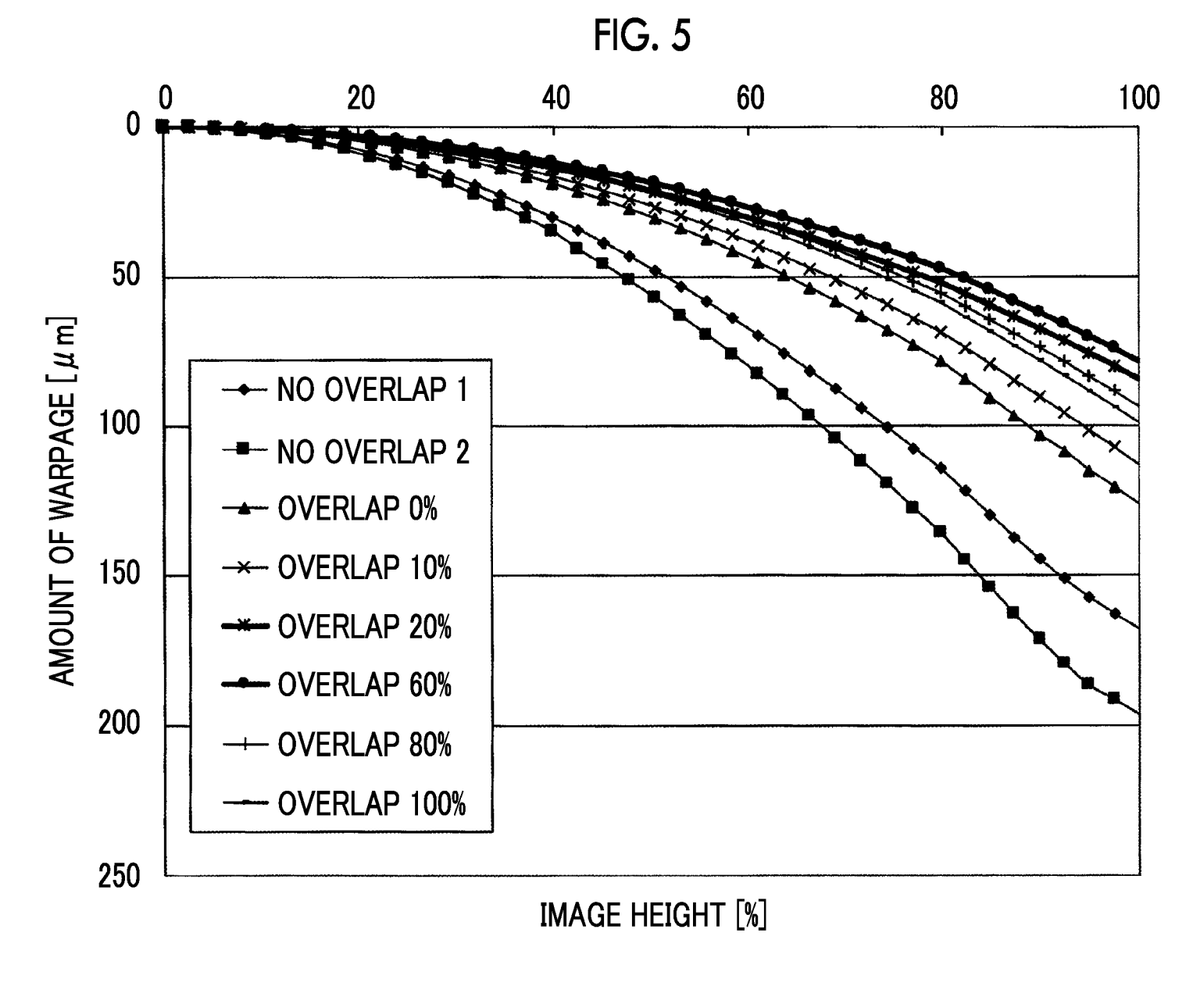
FIG. 5 is a diagram showing results obtained by simulating the amount of warpage of an imaging sensor chip 1 in the imager 50.

FIG. 5 is a diagram showing results obtained by simulating the amount of warpage of the imaging sensor chip 1 in the imager 50.

The vertical axis shown in FIG. 5 indicates the amount of warpage of the light receiving surface 10 of the imaging sensor chip 1. The amount of warpage indicates a value in a case where a position in an optical axis direction at an optical axis center of the light receiving surface 10 of the imaging sensor chip 1 that intersects an optical axis of the imaging lens 41 is set as a reference position.

The horizontal axis shown in FIG. 5 indicates a distance from the optical axis center of the light receiving surface 10 as an "image height". The image height=0% at the optical axis center of the light receiving surface 10, and the image height=100% at a position of the light receiving surface 10 farthest from the optical axis center.

A curve of "NO OVERLAP 1" shown in FIG. 5 indicates a simulation result in a state where the outer edge of the region 7A overlaps the bottom surface 2d instead of the wall portion 2b.

A curve of "NO OVERLAP 2" shown in FIG. 5 indicates a simulation result in a state where the outer edge of the region 7A overlaps the bottom surface 2d instead of the wall portion 2b, and the outer edge of the region 7A is located closer to the wall portion 2b than in the case of "NO OVERLAP 1".

A curve of "OVERLAP 0%" shown in FIG. 5 indicates a simulation result in a state where the outer edge of the region 7A overlaps the end of the wall portion 2b on the side of the concave portion 2c (state where $\alpha 1$, $\alpha 2$, $\alpha 3$, and $\alpha 4$ described above are all 0).

A curve of "OVERLAP 10%" shown in FIG. 5 indicates a simulation result in a state where the outer edge of the region 7A overlaps the wall portion 2b, and $\alpha 1$, $\alpha 2$, $\alpha 3$, and $\alpha 4$ described above are all 0.1.

A curve of "OVERLAP 20%" shown in FIG. 5 indicates a simulation result in a state where the outer edge of the region 7A overlaps the wall portion 2b, and $\alpha 1$, $\alpha 2$, $\alpha 3$, and $\alpha 4$ described above are all 0.2.

A curve of "OVERLAP 60%" shown in FIG. 5 indicates a simulation result in a state where the outer edge of the region 7A overlaps the wall portion 2b, and $\alpha 1$, $\alpha 2$, $\alpha 3$, and $\alpha 4$ described above are all 0.6.

A curve of "OVERLAP 80%" shown in FIG. 5 indicates a simulation result in a state where the outer edge of the region 7A overlaps the wall portion 2b, and α1, α2, α3, and α4 described above are all 0.8.

A curve of "OVERLAP 100%" shown in FIG. 5 indicates a simulation result in a state where the outer edge of the region 7A overlaps the end of the wall portion 2b on a side opposite to the side of the concave portion 2c (state where α1, α2, α3, and α4 described above are all 1.0).

From the simulation results shown in FIG. 5, it can be seen that the amount of warpage of the imaging sensor chip 1 can be reduced by overlapping the outer edge of the region 7A with the wall portion 2b.

Figure 6:
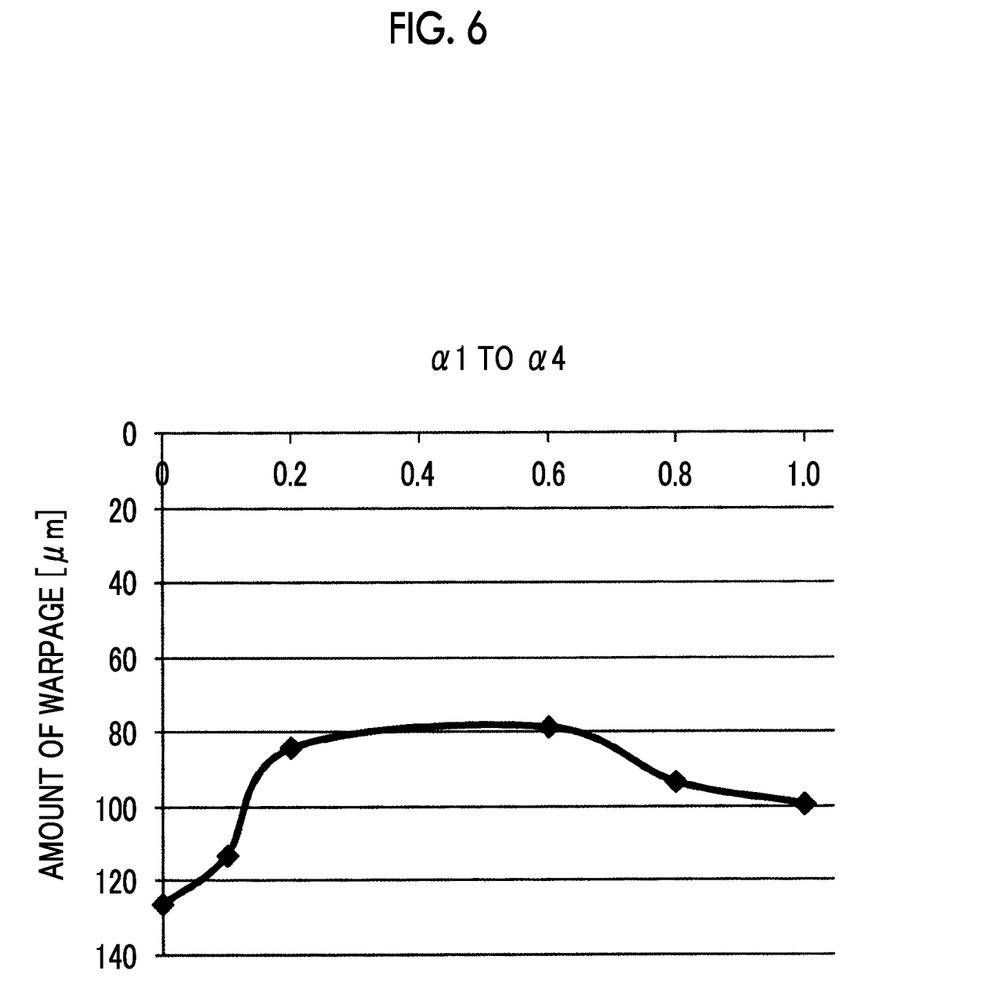
FIG. 6 is a diagram showing results of the amount of warpage in a case where an image height of the imaging sensor chip 1 in the imager 50 is 100%.

FIG. 6 is a graph showing the amount of warpage of the imaging sensor chip 1 in a case where the image height=100% in the simulation results of FIG. 5 in a case where each of α1, α2, α3, and α4 described above is 0, 0.1, 0.2, 0.6, 0.8, and 1.0.

From the results shown in FIG. 6, it can be seen that in a case where each of α1, α2, α3, and α4 described above is 0.2 or more, the amount of warpage of the imaging sensor chip 1 can be reduced to about 100 μm, which is a practically acceptable value. Furthermore, it can be seen that in a case where each of α1, α2, α3, and α4 described above is in a range of 0.2 or more and 0.6 or less, the amount of warpage of the imaging sensor chip 1 can be further reduced.

As described above, according to the imager 50, the outer edge of the region 7A overlaps the wall portion 2b, and each of α1, α2, α3, and α4 described above is 0.2 or more. Thereby, the warpage of the imaging sensor chip 1 due to a bimetal effect can be reduced, and the imaging quality can be improved.

According to the imager 50, the outer edge of the region 7A overlaps the wall portion 2b, and each of α1, α2, α3, and α4 described above is 0.2 or more and 0.6 or less. Thereby, the warpage of the imaging sensor chip 1 can be further reduced, and the imaging quality can be improved.

The above-described effect can be obtained by dispersing the stress generated by the bimetal effect to the protective cover 3. For this reason, it is preferable that a thickness of the adhesion material 4 that adheres the package 2 and the protective cover 3 to each other is as small as possible. By setting the thickness of the adhesion material 4 to 50 μm or less, the stress can be efficiently dispersed in the protective cover 3, and the effect of reducing the warpage of the imaging sensor chip 1 can be enhanced.

For the same reason, it is preferable that a Young's modulus indicating a stiffness of the adhesion material 4 that adheres the package 2 and the protective cover 3 to each other is as large as possible. By setting the Young's modulus of the adhesion material 4 to 1,000 MPa or more, the stress can be efficiently dispersed in the protective cover 3, and the effect of reducing the warpage of the imaging sensor chip 1 can be enhanced. It is preferable that an upper limit of the Young's modulus of the adhesion material 4 is smaller than the Young's modulus of the package 2 and the Young's modulus of the protective cover 3.

The warpage of the imaging sensor chip 1 due to the bimetal effect may occur in each of the long side direction and the short side direction. Therefore, there is the greatest effect of reducing the warpage in satisfying all of the above conditions (a) to (d). However, even with a configuration that satisfies only the conditions (a) and (b) or a configuration that satisfies only the conditions (c) and (d), it is possible to reduce the warpage of the imaging sensor chip 1.

In the imager 50 described above, the circuit board 52 is configured to have the opening 52k, and thus the shape of the region 7A is frame-shaped. However, in a case where the circuit board 52 has a flat plate shape not having the opening 52k, the planar shape of the region 7A may be rectangular.

As described above, the following items are described in the present specification.

(1)

An imager comprising: a fixing member that has a concave portion in which an imaging sensor chip is fixed to a bottom surface, a wall portion surrounding the concave portion, and a plurality of first terminals electrically connected to the imaging sensor chip; a sealing member that seals the imaging sensor chip by closing the concave portion in a state of overlapping the wall portion of the fixing member; a circuit board that is disposed facing a surface opposite to the bottom surface of the fixing member and has a larger linear expansion coefficient than the fixing member; and a conductive member that is provided between the first terminal exposed from the surface of the fixing member and a second terminal formed on the circuit board to fix the fixing member and the circuit board and electrically connect the first terminal and the second terminal to each other, in which, in a state of being viewed from a direction perpendicular to a light receiving surface of the imaging sensor chip, an outer edge of a region where the conductive member is disposed overlaps the wall portion of the fixing member, and a distance between a position overlapping the outer edge in the wall portion and an end of the wall portion on a side of the concave portion is 20% or more of a width of the wall portion in a direction parallel to the light receiving surface.

(2)

The imager according to (1), in which the distance is 60% or less of the width of the wall portion in the direction parallel to the light receiving surface.

(3)

The imager according to (1) or (2), in which the sealing member and the wall portion are fixed by an adhesion material having a thickness of 50 μm or less.

(4)

The imager according to (1) or (2), in which the sealing member and the wall portion are fixed by an adhesion material having a Young's modulus of 1000 MPa or more.

(5)

An imaging device comprising:

the imager according to any one of (1) to (4).

Although various embodiments have been described with reference to the drawings, it goes without saying that the present invention is not limited to such examples. It is obvious that a person skilled in the art is able to find various modification examples and adjustment examples within the scope of the appended claims, and it should be understood that these modification examples and adjustment examples naturally belong to the technical scope of the present invention. Further, the components according to the above-described embodiment may be arbitrarily combined with each other, without departing from the spirit of the invention.

This application is based on Japanese Patent Application filed on Jan. 29, 2018 (JP2018-012900), the content of which is incorporated herein by reference.

The present invention is highly convenient and effective to be applied to an electronic device having an imaging function, such as a digital camera, a smartphone, a tablet terminal, a personal computer, a robot, or an endoscope.

EXPLANATION OF REFERENCES

100: digital camera
11: system controller

14: operator
41: imaging lens
42: stop
43: lens driver
44: stop driver
45: lens controller
50: imager
51: imaging sensor
52: circuit board
15: memory controller
16: main memory
17: digital signal processor
20: external memory controller
21: storage medium
22: display controller
23: display unit
1: imaging sensor chip
2: package
2a: bottom portion
2b: wall portion
2c: concave portion
2d: bottom surface
2e: rear surface
3: protective cover
4: adhesion material
5: adhesion member
7: conductive member
7A: region
10: light receiving surface
52a: surface
52k: opening
EX1, EX2, EY1, EY2: edge
EX3, EX4, EY3, EY4: end
L1, L2, L3, L4: distance
XD1, XD2, YD1, YD2: width

What is claimed is:

1. An imager comprising:
a fixing member that has a concave portion in which an imaging sensor chip is fixed to a bottom surface of the concave portion, a wall portion surrounding the concave portion, and a plurality of first terminals electrically connected to the imaging sensor chip;
a sealing member that seals the imaging sensor chip by closing the concave portion in a state of overlapping the wall portion of the fixing member;
a circuit board that is disposed facing a surface, opposite to the bottom surface, of the fixing member and has a larger linear expansion coefficient than the fixing member; and
a conductive member that is provided between the first terminals exposed from the surface of the fixing member and a second terminal formed on the circuit board to fix the fixing member and the circuit board and electrically connect the first terminal and the second terminal to each other,
wherein, in a state of being viewed from a direction perpendicular to a light receiving surface of the imaging sensor chip, an outer edge of a region where the conductive member is disposed overlaps the wall portion of the fixing member, and
a distance between a position overlapping the outer edge in the wall portion and an end of the wall portion on a side of the concave portion is 20% or more of a width of the wall portion in a direction parallel to the light receiving surface.

2. The imager according to claim 1,
wherein the distance is 60% or less of the width of the wall portion in the direction parallel to the light receiving surface.

3. The imager according to claim 1,
wherein the sealing member and the wall portion are fixed by an adhesion material having a thickness of 50 μm or less.

4. The imager according to claim 2,
wherein the sealing member and the wall portion are fixed by an adhesion material having a thickness of 50 μm or less.

5. The imager according to claim 1,
wherein the sealing member and the wall portion are fixed by an adhesion material having a Young's modulus of 1000 MPa or more.

6. The imager according to claim 2,
wherein the sealing member and the wall portion are fixed by an adhesion material having a Young's modulus of 1000 MPa or more.

7. An imaging device comprising:
the imager according to claim 1.

* * * * *